(12) United States Patent
Murata et al.

(10) Patent No.: US 9,068,261 B2
(45) Date of Patent: Jun. 30, 2015

(54) ATOMIC LAYER DEPOSITION APPARATUS AND THIN FILM FORMING METHOD

(75) Inventors: Kazutoshi Murata, Tamano (JP); Yasunari Mori, Tamano (JP)

(73) Assignee: MITSUI ENGINEERING & SHIPBUILDING CO., LTD., Tokyo (JP)

( * ) Notice: Subject to any disclaimer, the term of this patent is extended or adjusted under 35 U.S.C. 154(b) by 911 days.

(21) Appl. No.: 13/203,400

(22) PCT Filed: Mar. 3, 2010

(86) PCT No.: PCT/JP2010/001462
§ 371 (c)(1),
(2), (4) Date: Aug. 25, 2011

(87) PCT Pub. No.: WO2010/103751
PCT Pub. Date: Sep. 16, 2010

(65) Prior Publication Data
US 2011/0305836 A1    Dec. 15, 2011

(30) Foreign Application Priority Data

Mar. 10, 2009  (JP) .................................. 2009-056642

(51) Int. Cl.
*C23C 16/455* (2006.01)
*C23C 14/56* (2006.01)
(Continued)

(52) U.S. Cl.
CPC ......... *C23C 16/45544* (2013.01); *C23C 14/562* (2013.01); *C23C 14/56* (2013.01);
(Continued)

(58) Field of Classification Search
CPC   C23C 16/52; C23C 16/458; C23C 16/45553; C23C 16/45525; C23C 14/568; C23C 16/45544; C23C 14/56; C23C 14/562

USPC ......................... 118/719; 156/345.32, 345.31
See application file for complete search history.

(56) References Cited

U.S. PATENT DOCUMENTS 3,954,191 A * 5/1976 Wittkower et al. ........... 414/217
4,030,622 A * 6/1977 Brooks et al. ................. 414/290
(Continued)

FOREIGN PATENT DOCUMENTS

DE         19847101 C1 * 5/2000
JP         02152251 A  * 6/1990
(Continued)

*Primary Examiner* — Rudy Zervigon
(74) *Attorney, Agent, or Firm* — Global IP Counselors, LLP (57) ABSTRACT

An atomic layer deposition apparatus, which forms a thin film on a substrate, includes a first container that defines a first inner space and includes a substrate carrying-in and carrying-out port and a gas introduction port in different positions, the substrate being carried in and out through the substrate carrying-in and carrying-out port, gas being introduced through the gas introduction port to form the thin film on the substrate, a second container that is provided in the first container to define a second inner space separated from the first inner space, the second container including a first opening, a first moving mechanism that moves the second container in a predetermined direction, and a controller that controls the first moving mechanism such that the second container is moved to a first position where the substrate carrying-in and carrying-out port and the first opening are located opposite each other when the substrate is carried in and out, the controller controlling the first moving mechanism such that the second container is moved to a second position where the gas introduction port and the first opening are located opposite each other when the thin film is formed on the substrate.

5 Claims, 4 Drawing Sheets

(51) Int. Cl.
*C23C 16/458* (2006.01)
*C23C 16/52* (2006.01)
*H01J 37/32* (2006.01)
*C23C 16/50* (2006.01)
*C23C 16/44* (2006.01)
*C23C 16/46* (2006.01)
*C23C 16/54* (2006.01)
C23C 16/06 (2006.01)
C23C 16/22 (2006.01)

(52) U.S. Cl.
CPC ........ *C23C 14/568* (2013.01); *H01J 37/32752*
(2013.01); *C23C 16/45525* (2013.01); *C23C 16/45553* (2013.01); *C23C 16/50* (2013.01);
*C23C 16/4401* (2013.01); *C23C 16/4409*
(2013.01); *C23C 16/46* (2013.01); *C23C 16/54*
(2013.01)

(56) References Cited

U.S. PATENT DOCUMENTS

| | | | | |
|---|---|---|---|---|
| 4,141,458 A * | 2/1979 | Brooks et al. | 414/331.18 |
| 4,895,107 A * | 1/1990 | Yano et al. | 118/722 |
| 5,088,444 A * | 2/1992 | Ohmine et al. | 118/719 |
| 5,223,001 A * | 6/1993 | Saeki | 29/25.01 |
| 5,314,574 A * | 5/1994 | Takahashi | 438/706 |
| 5,474,613 A * | 12/1995 | Pickering et al. | 118/725 |
| 5,520,743 A * | 5/1996 | Takahashi | 118/730 |
| 5,772,770 A * | 6/1998 | Suda et al. | 118/719 |
| 6,074,538 A * | 6/2000 | Ohmi et al. | 204/298.06 |
| 6,183,564 B1 * | 2/2001 | Reynolds et al. | 118/719 |
| 6,234,107 B1 * | 5/2001 | Tanaka et al. | 118/723 R |
| 6,273,664 B1 * | 8/2001 | Doche | 414/217 |
| 6,394,733 B1 * | 5/2002 | Toda et al. | 414/221 |
| 6,409,837 B1 * | 6/2002 | Hillman | 118/712 |
| 6,455,098 B2 * | 9/2002 | Tran et al. | 427/8 |
| 6,620,251 B2 * | 9/2003 | Kitano | 118/725 |
| 6,630,053 B2 * | 10/2003 | Yamagishi et al. | 156/345.32 |
| 6,663,714 B2 * | 12/2003 | Mizuno et al. | 118/719 |
| 6,806,211 B2 * | 10/2004 | Shinriki et al. | 438/785 |
| 6,846,380 B2 * | 1/2005 | Dickinson et al. | 156/345.31 |
| 7,018,504 B1 * | 3/2006 | Raaijmakers et al. | 156/345.31 |
| 7,085,616 B2 * | 8/2006 | Chin et al. | 700/121 |
| 7,422,636 B2 * | 9/2008 | Ishizaka | 118/719 |
| 7,670,432 B2 * | 3/2010 | Li | 118/715 |
| 7,682,454 B2 * | 3/2010 | Sneh | 118/719 |
| 7,723,218 B2 * | 5/2010 | Yamazaki et al. | 438/485 |
| 7,740,705 B2 * | 6/2010 | Li | 118/715 |
| 7,794,546 B2 * | 9/2010 | Li | 118/733 |
| 7,860,597 B2 * | 12/2010 | Chin et al. | 700/112 |
| 7,993,457 B1 * | 8/2011 | Krotov et al. | 118/719 |
| 8,027,746 B2 * | 9/2011 | Chin et al. | 700/112 |
| 8,052,887 B2 * | 11/2011 | Nozawa et al. | 216/67 |
| 8,148,271 B2 * | 4/2012 | Ueno et al. | 438/748 |
| 8,278,195 B2 * | 10/2012 | Yamazaki et al. | 438/485 |
| 8,293,014 B2 * | 10/2012 | Kurokawa | 118/715 |
| 8,349,085 B2 * | 1/2013 | Tahara et al. | 118/719 |
| 8,388,755 B2 * | 3/2013 | Arena et al. | 118/724 |
| 8,545,940 B2 * | 10/2013 | Choi et al. | 427/255.15 |
| 8,626,330 B2 * | 1/2014 | Chin et al. | 700/112 |
| 8,627,783 B2 * | 1/2014 | Fischer et al. | 118/723 R |
| 8,683,943 B2 * | 4/2014 | Onodera et al. | 118/723 E |
| 8,696,814 B2 * | 4/2014 | Morisaki et al. | 118/725 |
| 2001/0021486 A1 * | 9/2001 | Kitano | 430/322 |
| 2002/0041931 A1 * | 4/2002 | Suntola et al. | 427/255.28 |
| 2006/0130761 A1 * | 6/2006 | Sakai | 118/719 |
| 2006/0180082 A1 * | 8/2006 | Iwamoto et al. | 118/724 |
| 2006/0213439 A1 * | 9/2006 | Ishizaka | 118/715 |
| 2007/0107661 A1 * | 5/2007 | Ahn | 118/719 |
| 2007/0184210 A1 * | 8/2007 | Hwang | 427/569 |
| 2008/0179006 A1 * | 7/2008 | Tahara et al. | 156/345.29 |
| 2009/0291566 A1 * | 11/2009 | Ueno et al. | 438/758 |
| 2010/0075488 A1 * | 3/2010 | Collins et al. | 438/507 |
| 2011/0008550 A1 * | 1/2011 | Murata et al. | 427/569 |
| 2011/0303147 A1 * | 12/2011 | Tachibana et al. | 118/715 |
| 2011/0305836 A1 * | 12/2011 | Murata et al. | 427/255.28 |
| 2013/0340938 A1 * | 12/2013 | Tappan et al. | 156/345.29 |
| 2014/0209024 A1 * | 7/2014 | Kim et al. | 118/719 |

FOREIGN PATENT DOCUMENTS

| | | |
|---|---|---|
| JP | 2002-534786 A | 10/2002 |
| JP | 2006-222468 A | 8/2006 |
| JP | 2006-310813 A | 11/2006 |
| JP | 2007-27791 A | 2/2007 |
| JP | 2008-240077 A | 10/2008 |

* cited by examiner

ATOMIC LAYER DEPOSITION APPARATUS AND THIN FILM FORMING METHOD

TECHNICAL FIELD

The present invention relates to an atomic layer deposition (hereinafter also abbreviated to ALD (Atomic Layer Deposition)) apparatus that forms a thin film on a substrate and a thin film forming method for forming the thin film on the substrate by an atomic layer deposition method.

BACKGROUND ART

In the ALD method that is of one of thin-film forming techniques, two kinds of gases composed mostly of elements constituting a film to be formed are alternately supplied onto a deposition target substrate, and the thin film is repeatedly formed plural times in units of atomic layers on the substrate, thereby forming the film having a desired thickness. For example, a source gas containing Si and an oxidation gas containing O are used when a $SiO_2$ film is formed on the substrate. A nitridation gas is used instead of the oxidation gas when a nitride film is formed on the substrate.

So-called growth self-stopping action (self-limiting function) is utilized in the ALD method. That is, only a source gas component for one or several layers is adsorbed to a substrate surface while the source gas is supplied, but the excess source gas does not contribute to the growth.

When compared with a general CVD (Chemical Vapor Deposition) method, advantageously the ALD method has both high step coverage and film-thickness controllability. Therefore, the ALD method is expected to be practically applied to the formation of a capacitor for a memory element or an insulating film called "high-k gate." Additionally, because the insulating film can be formed at a temperature of 300° C. or less in the ALD method, the ALD method is also expected to be applied to the formation of a gate insulating film for a thin-film transistor in a display device such as a liquid crystal display in which a glass substrate is used.

For example, Patent Document 1 describes an ALD apparatus for forming the thin film on the substrate, including a source gas adsorption chamber in which at least one kind of the source gas is adsorbed to the substrate, a reactive gas irradiation chamber in which the substrate is irradiated with at least one kind of a reactive gas, and means for changing the substrate between the source gas adsorption chamber and the reactive gas irradiation chamber.

The apparatus of Patent Document 1 is implemented to provide the apparatus that can efficiently perform the deposition without requiring frequent maintenance of the deposition chamber in vacuum deposition by the ALD method.

PRIOR ART DOCUMENT

Patent Document

Patent Document 1: Japanese Patent Application Laid-Open No. 2008-240077

DISCLOSURE OF THE INVENTION

Problem to be Solved by the Invention

In the apparatus of Patent Document 1, because the deposition chamber is separated in each necessary process, the deposition is not performed in wall surfaces of both the source gas adsorption chamber and the reactive gas irradiation chamber, the maintenance of the deposition chamber is not required unlike prior art, and a highly-reactive radical can effectively be used. However, the apparatus of Patent Document 1 becomes enlarged and increases in cost. Particularly, an installation area and facility cost increase largely when an eighth-generation glass plate whose one side exceeds 2 m becomes a target substrate on which the thin film is formed.

In order to suppress the cost, an object of the invention is to provide an atomic layer deposition apparatus and a thin film forming method for being able to form the thin film having even film quality on the substrate while having one deposition chamber unlike the configuration of the ALD apparatus of Patent Document 1.

Means for Solving the Problems

An atomic layer deposition apparatus according to a present invention forms a thins film on a substrate. The atomic layer deposition apparatus comprising: a first container that defines a first inner space and includes a substrate carrying-in and carrying-out port and a gas introduction port in different positions, the substrate being carried in and out through the substrate carrying-in and carrying-out port, gas being introduced through the gas introduction port to form the thin film on the substrate; a second container that is provided inside the first container to define a second inner space separated from the first inner space, the second container including a first opening; a first moving mechanism that moves the second container in a predetermined direction; and a controller that controls the first moving mechanism such that the second container is moved to a first position where the substrate carrying-in and carrying-out port and the first opening are located opposite each other when the substrate is carried in and out, the controller controlling the first moving mechanism such that the second container is moved to a second position where the gas introduction port and the first opening are located opposite each other when the thin film is formed on the substrate.

A thin film forming method according to a present invention is used to form a thin film on a substrate by an atomic layer deposition method using a first container that defines a first inner space and a second container that is provided inside the first container and defines a second inner space separated from the first inner space. The thin film forming method comprising: a substrate carrying-in process in which a first opening included in the second container moves to a first position included in the first container to carry in the substrate, the first position being located opposite a substrate carrying-in and carrying-out port through which the substrate is carried in and out; a thin film forming process in which the first opening moves to a second position included in the first container to form the thin film, the second position being located opposite a gas introduction port through which a gas forming the thin film on the substrate is introduced to the second inner space; and a substrate carrying-out process in which the first opening moves to a position located opposite the substrate carrying-in and carrying-out port to carry out the substrate.

Effects of the Invention

According to the atomic layer deposition apparatus and the thin film forming method of the invention, the thin film having the even film quality can be formed on the substrate.

EMBODIMENT FOR CARRYING OUT THE INVENTION

Hereinafter, an atomic layer deposition apparatus and a thin film forming method according to an embodiment of the invention will be described in detail.

<Schematic Configuration of Atomic Layer Deposition Apparatus>

In an atomic layer deposition apparatus 10, a source gas such as TMA (Tri-Methyl-Aluminium) and an oxidation gas such as ozone $O_3$ are alternately supplied to perform deposition in units of atoms, thereby forming a thin film.

Figure 1:
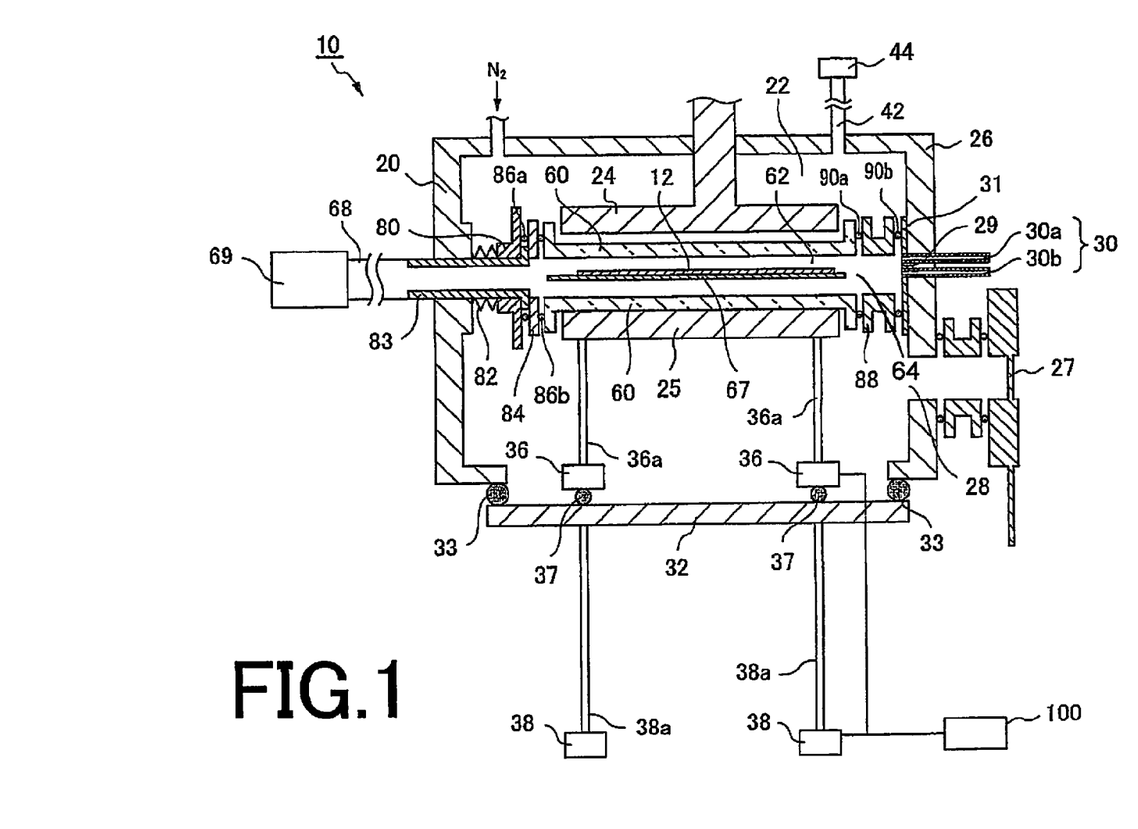
FIG. 1 is a sectional view illustrating a schematic configuration of an atomic layer deposition apparatus according to an embodiment of the invention during a thin film forming process.

FIG. 1 is a sectional view illustrating a schematic configuration of the atomic layer deposition apparatus (hereinafter referred to as an ALD apparatus) 10 that forms the thin film on a substrate 12 in a thin film forming process.

The ALD apparatus 10 mainly includes a first container 20, a second container 60, and a pressing member 80. The first container 20 is an outside container that defines a first inner space 22 to maintain a predetermined pressure. The second container 60 is an inside container provided in the first container 20, and the second container 60 defines a second inner space 62 to maintain a predetermined pressure. The pressing member 80 presses the second container 60 to separate the second inner space 62 from the first inner space 22.

Configurations of the first container 20, the second container 60, and the pressing member 80 will be described in detail below.

(First Container)

First, the first container 20 will be described with reference to FIG. 1.

The first container 20 is made of a metallic material such as SUS. A gas introduction port through which a $N_2$ gas (or inert gas) is introduced to the first inner space 22 is provided in an upper wall of the first container 20. An exhaust port to which an exhaust pipe 42 is connected is provided in an upper wall of the first container 20. The gas in the first inner space 22 is exhausted to the outside of the first container 20 by an exhaust unit 44 such as a turbo molecular pump. Therefore, the first inner space 22 is maintained at a predetermined pressure in an atmosphere of the introduced $N_2$ gas. Oxidation of heaters 24 and 25 (described later) can be suppressed by reducing the first inner space 22 to the predetermined pressure.

The heater 24 is provided parallel to and above the second container 60 provided inside the first container 20. The heater 24 heats the substrate 12 placed in the second container 60 and the source gas supplied to the second inner space 62 through the second container 60. A wiring and the like of the heater 24 are extracted to the outside through a through-hole made in an upper portion of the first container 20 and connected to a power supply (not illustrated).

The heater 25 is provided parallel to and below the second container 60 provided inside the first container 20. The heater 25 heats the substrate 12 placed in the second container 60 and the source gas supplied to the second inner space 62 through the second container 60. A wiring and the like of the heater 25 are extracted to the outside of the first container 20 through a through-hole (not illustrated) and connected to the power supply (not illustrated).

A substrate carrying-in and carrying-out port 28 is provided in a wall surface 26 (surface on the right side in FIG. 1) of the first container 20 to carry in and out the substrate 12. A shutter 27 connected to the outside of the first container 20 is provided in a portion that is horizontally extended from the substrate carrying-in and carrying-out port 28 toward the outside of the first container 20. Accordingly, when the substrate 12 is carried in, the shutter 27 is opened to carry the substrate 12 in the first container 20 through the substrate carrying-in and carrying-out port 28. When the substrate 12 is carried out, the shutter 27 is opened to carry out the substrate 12 from the first container 20 through the substrate carrying-in and carrying-out port 28.

Figure 3:
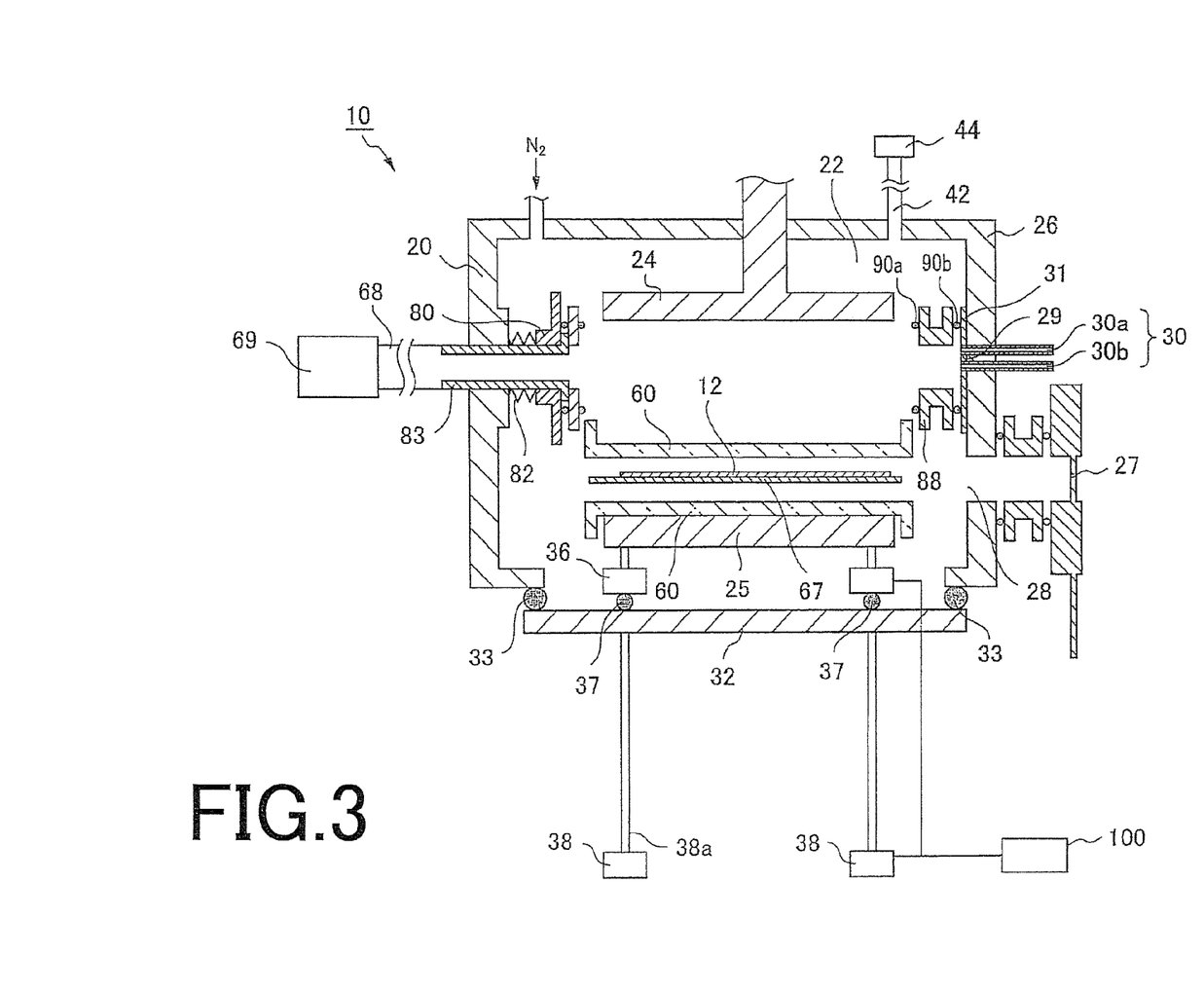
FIG. 3 is a sectional view illustrating states in a substrate carrying-in process and a substrate carrying-out process in the atomic layer deposition apparatus of FIG. 1.

FIG. 3 illustrates the carrying-in and carrying-out state of the substrate 12. The carrying-in and carrying-out state of the substrate 12 in FIG. 3 is described later.

In order to introduce the gas that forms the thin film on the substrate to the inside, a gas introduction port 29 is provided in the wall surface 26 in which the substrate carrying-in and carrying-out port 28 is provided. A gas introduction pipe 30 is connected to the gas introduction port 29 to introduce the source gas and the oxidation gas to the second inner space 62. In the embodiment, two gas introduction pipes 30a and 30b are connected as illustrated in FIG. 1.

The source gas (for example, organic metal gas such as TMA) and a purge gas (for example, nitrogen gas) are introduced to the second inner space 62 through the gas introduction pipe 30a. The oxidation gas (for example, ozone) and the purge gas (for example, nitrogen gas) are introduced to the second inner space 62 through the gas introduction pipe 30b.

In order to evenly supply the source gas to the substrate 12, plural gas introduction ports 29 are provided at equal intervals in a width direction (direction perpendicular to a paper plane of FIG. 1) of the substrate 12. The gas introduction ports 29 are provided in a range wider than that in the width direction of the substrate 12.

In the embodiment, as illustrated in FIG. 1, the gas introduction ports 29 are provided immediately above a substrate support portion 67 (described later).

A through-hole through which an exhaust pipe 68 (described later) penetrates is provided in the other wall surface (surface on the left side in FIG. 1) of the first container 20.

First moving mechanisms 36 are provided on a bottom surface 32 of the first container 20 to vertically move the heater 25. The heater 25 can vertically be moved by adjusting lengths of support mechanisms 36a extended from the first moving mechanisms 36. Because the heater 25 supports the second container 60, the second container 60 can be supported in a predetermined position by controlling the lengths of the support mechanisms 36a extended from the first moving mechanisms 36.

The first moving mechanism 36 includes a caster 37 to be able to move in an in-plane direction of the bottom surface 32 of the first container 20.

The bottom surface 32 of the first container 20 can be separated from the wall surface and the upper wall of the first container 20. Two support mechanisms 38a extended downward in the drawings are provided in the bottom surface 32 of the first container 20, and second moving mechanisms 38 such as hydraulic cylinders are provided in the support mechanisms 38a, respectively. The support mechanisms 38a of the second moving mechanisms 38 vertically move the bottom surface 32 of the first container 20, the first moving mechanisms 36, the heater 25 supported by the support mechanisms 36a of the first moving mechanisms 36, and the second container 60 supported by the heater 25. An O-ring 33 is provided between the bottom surface 32 and the wall surface of the first container 20, whereby the second moving mechanisms 38 lift the bottom surface 32 to close the first inner space 22 from the outside.

The first moving mechanism 36 and the second moving mechanism 38 are connected to a controller 100. The controller 100 controls the first moving mechanisms 36 and the second moving mechanisms 38 such that the second container 60 is located in a predetermined position. The moving mechanisms 36 and 38 controlled by the controller 100 are described in detail later.

According to the embodiment, the substrate carrying-in and carrying-out port 28, the gas introduction port 29, and the through-hole through which the exhaust pipe 68 penetrates can separately be made. Therefore, the restriction to the structure of the gas introduction ports 29 that evenly supply the source gas can be eliminated to form the thin film having the even film quality.

(Second Container)

Figure 2A:
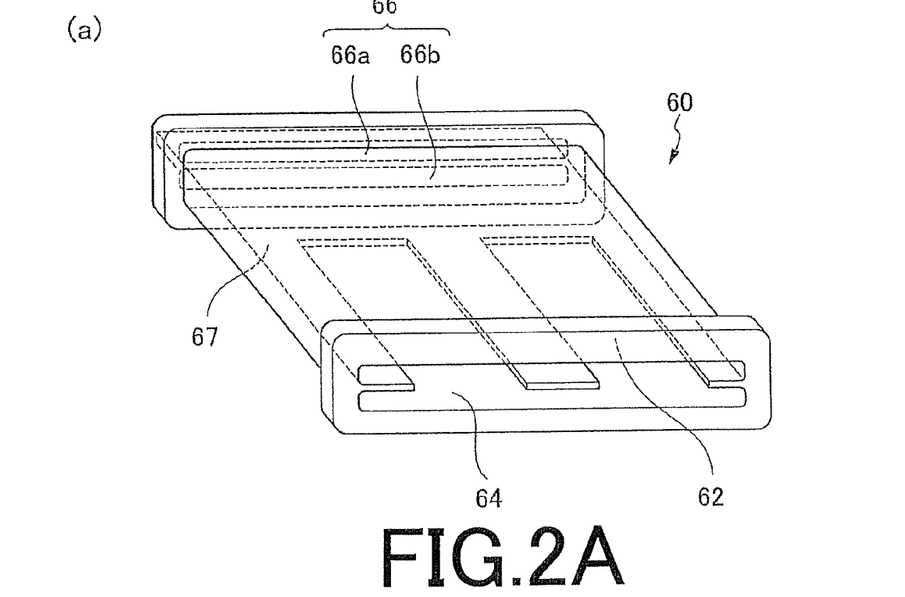
FIG. 2(a) is a schematic diagram illustrating a configuration of a second container in the atomic layer deposition apparatus of FIG. 1.

Then the second container 60 will be described with reference to FIG. 2. FIG. 2(a) is a schematic diagram illustrating the configuration of the second container 60.

The second container 60 is provided in the first container 20. The second container 60 is a canister-shaped container that defines the second inner space 62. Preferably the second container 60 is made of quartz from the viewpoint of a stable material. When a glass substrate is used as the substrate 12, because the substrate 12 is substantially identical to the second container 60 in the material, advantageously there is no risk that a different component adheres to the substrate 12.

The second container 60 is supported by the support mechanism 36a so as to be horizontally located in the first container 20. A first opening 64 is provided at one end of the canister-shaped second container 60, and the source gas that forms the thin film on the substrate 12 flows through the first opening 64. In a thin film forming process illustrated in FIG. 1, the first opening 64 is located opposite the gas introduction port 29 provided in the wall surface 26 of the first container 20.

A second opening 66 is provided at an opposite end to the side on which the first opening 64 is provided, and the gas in the second inner space 62 flows to the outside of the second inner space 62 through the second opening 66. In the embodiment, two second openings 66a and 66b are provided as illustrated in FIG. 2(a). The second opening 66a is provided immediately above a substrate support portion 67 (described later).

The gas flowing to the outside of the second inner space 62 through the second opening 66 is exhausted by an exhaust unit 69 such as a vacuum pump through a through-hole made in the left wall surface of the first container 20 and an exhaust pipe 68 connected to the through-hole. Therefore, the second inner space 62 is maintained at a predetermined pressure in an atmosphere of the introduced source gas. The pressure of the second inner space 62 may be equal to or different from that of the first inner space 22.

Figure 2B:
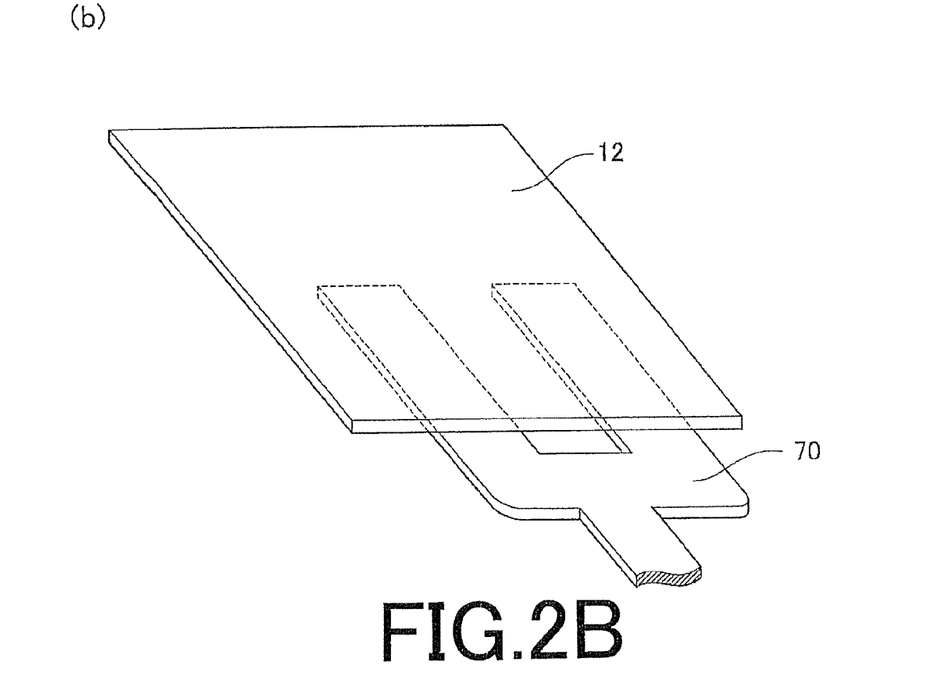
FIG. 2(b) is a view illustrating a method for carrying in and out a substrate.

FIG. 2(b) is a view illustrating a method for carrying in and out the substrate 12. The substrate 12 is placed on a fork portion 70 at a substrate placing leading end of a conveyance carriage. The shutter 27 is opened, and the substrate 12 placed on the fork portion 70 is carried in and out from the second container 60 through the substrate carrying-in and carrying-out port 28 and the first opening 64. The substrate carrying-in process and the substrate carrying-out process are described in detail later.

The substrate support portion 67 is provided in the second container 60 to place the substrate 12 thereon. The substrate support portion 67 is provided in an intermediate position in a height direction of the second inner space 62. The substrate support portion 67 includes a plane that is provided in parallel with the longitudinal direction of the canister-shaped second container 60. The plane is used as a substrate placing surface. The side of the first opening 64 of the substrate support portion 67 is formed into a comb shape corresponding to the fork portion 70 at the substrate placing leading end of the conveyance carriage that carries in and out the substrate 12.

Thus, the side of the first opening 64 is formed into the comb shape corresponding to the fork portion 70. Therefore, even if the large substrate 12 is carried in and out from the second inner space 62 having the low-profile canister shape, the substrate 12 can be carried in and out while the surface on which the thin film is formed does not come into contact with the inner surface of the second container 60.

The source gas passes over the substrate 12 placed on the substrate support portion 67, and part of the source gas is adsorbed to the substrate 12. The heated, activated oxidation gas can oxidize the source gas component adsorbed to the substrate 12.

(Pressing Member)

A pressing member 80 will be described below with reference to FIG. 1. The pressing member 80 presses the second container 60 in the longitudinal direction (horizontal direction) of the canister-shaped second container 60. An O-ring 86a, a spacer 84, and an O-ring 86b are provided in order between the pressing member 80 and the second container 60. A square-shaped bellows 82 is provided between the pressing member 80 and the wall surface on the left side of the first container 20 in FIG. 1. Therefore, the pressing member 80 can horizontally move. An O-ring 90a, a spacer 88, and an O-ring 90b are provided in order between the second container 60 and the wall surface 26 (surface on the right side in FIG. 1) of the first container 20. Anti-adhesion plates 31 and 83 are provided at an inner wall of the wall surface 26 near the gas introduction port 29 and an inner wall of the exhaust pipe 68 in order to prevent the thin film from adhering to other portions except the substrate on which the thin film should be formed.

The second container 60 is supported by the first moving mechanism 36 including the caster 37. Therefore, the canister-shaped second container 60 can move in the longitudinal direction. The pressing member 80 presses the second container 60 in the longitudinal direction of the canister-shaped second container 60, whereby the second container 60 is pressed against the first container 20 with the O-rings 86a, 86b, 90a, and 90b interposed therebetween. As a result, the second inner space 62 is separated from the first inner space 22. The pressing member 80 presses the second container 60 in the longitudinal direction of the canister-shaped second container 60, thereby separating the second inner space 62 from the first inner space 22.

As used herein, separating the second inner space 62 from the first inner space 22 means that the pressure of the first inner space 22 and the pressure of the second inner space 62 are spatially separated to an extent to which the pressure of the first inner space 22 and the pressure of the second inner space 62 can individually be controlled.

Generally, when a space is sealed by the O-ring, the two spaces can more securely be separated from each other with shortening circumference of the O-ring. In the configuration illustrated in FIG. 1, because the second container 60 is pressed in the longitudinal direction of the canister-shaped second container 60, the circumference of the O-ring necessary to separate the second inner space 62 from the first inner space 22 can be shortened in association with the canister-shaped second container 60.

As described above, the second inner space 62 of the second container 60 can more securely be separated from the first inner space 22 by the configuration in which the second container 60 is pressed in the longitudinal direction of the canister-shaped second container 60. Therefore, a leak of the source gas from the second inner space 62 to the first inner space 22 can be suppressed.

The leak of the source gas from the second inner space 62 to the first inner space 22 is suppressed to suppress the film formation in the inner surface of the first inner space 22 by the source gas leaking to the first inner space 22, so that resultant particles can be reduced. The mixture of the particles, which exist in the first inner space 22, in the second inner space 62 can be suppressed by separating more securely the second inner space 62 from the first inner space 22. Accordingly, in the embodiment, as illustrated in FIG. 1, the thin film having the evener film quality can be deposited such that the pressing member 80 presses the second container 60 in the longitudinal direction of the canister-shaped second container 60.

<Schematic Process of Atomic Layer Deposition Method>

An atomic layer deposition method of the embodiment will be described below.

(Substrate Carrying-In Process)

First, the substrate carrying-in process will be described. FIG. 3 is a sectional view illustrating a state on the atomic layer deposition apparatus 10 during the substrate carrying-in process. The first opening 64 of the second container 60 is located opposite the substrate carrying-in and carrying-out port 28. Hereinafter, the position of the second container 60 in the state in which the first opening 64 and the substrate carrying-in and carrying-out port 28 are located opposite each other is referred to as a first position. That is, during the substrate carrying-in process, the second container 60 is located in the first position.

The second container 60 moves to the first position, when the second container 60 is not located in the first position in carrying in the substrate. The controller 100 controls the first moving mechanism 36 to move the second container 60.

The shutter 27 is opened, and the substrate 12 is carried in the second container 60 through the shutter 27, the substrate carrying-in and carrying-out port 28, and the first opening 64. As illustrated in FIG. 2(b), the substrate 12 is carried in while placed on the fork portion 70 at the substrate placing leading end of the conveyance carriage.

(Thin Film Forming Process)

The thin film forming process will be described below. FIG. 1 is a sectional view illustrating a state of the atomic layer deposition apparatus 10 during the thin film forming process. The first opening 64 of the second container 60 is located opposite the gas introduction port 29. Hereinafter, the position of the second container 60 in the state in which the first opening 64 and the gas introduction port 29 are located opposite each other is referred to as a second position. That is, during the thin film forming process, the second container 60 is located in the second position.

The second container 60 moves to the second position, when the second container 60 is not located in the second position in forming the thin film on the substrate. The controller 100 controls the first moving mechanism 36 to move the second container 60.

After the second container 60 moves to the second position, the pressing member 80 presses the second container 60 in the longitudinal direction (horizontal direction) of the canister-shaped second container 60. Therefore, the second inner space 62 is separated from the first inner space 22. Then the source gas is caused to flow from the gas introduction pipe 30 to the second inner space 62 to form the thin film on the substrate 12.

(Substrate Carrying-Out Process)

The substrate carrying-out process will be described below. FIG. 3 is a sectional view illustrating a state of the atomic layer deposition apparatus 10 during the substrate carrying-out process. The second container 60 is located in the first position.

When the thin film forming process is ended, the pressing member 80 presses the second container 60 against the first container 20. The pressing member 80 moves in the direction (left direction in FIG. 1) in which the pressing member 80 is separated from the second container 60, thereby releasing the press of the second container 60.

Then the second container 60 moves to the first position. The controller 100 controls the first moving mechanism 36 to move the second container 60.

The shutter 27 is opened, and the substrate 12 is carried out from the second container 60 through the first opening 64, the substrate carrying-in and carrying-out port 28, and the shutter 27. As illustrated in FIG. 2(b), the substrate 12 is carried out while placed on the fork portion 70 at the substrate placing leading end of the conveyance carriage.

In the ALD apparatus 10, the second inner space 62 in which the thin film is formed and the first inner space 22 in which the substrate is carried in and out can be separated from each other by the configuration simpler than ever before, namely, the configuration in which the second container 60 is moved in the first container 20. Therefore, the inner wall surface of the first container 20, the inner wall surface of the substrate carrying-in and carrying-out port 28, and the inner wall surface of the shutter 27 are not exposed to the source gas, so that the mixture of the particles can be suppressed in carrying in and out the substrate 12.

(Cleaning Process)

Figure 4:
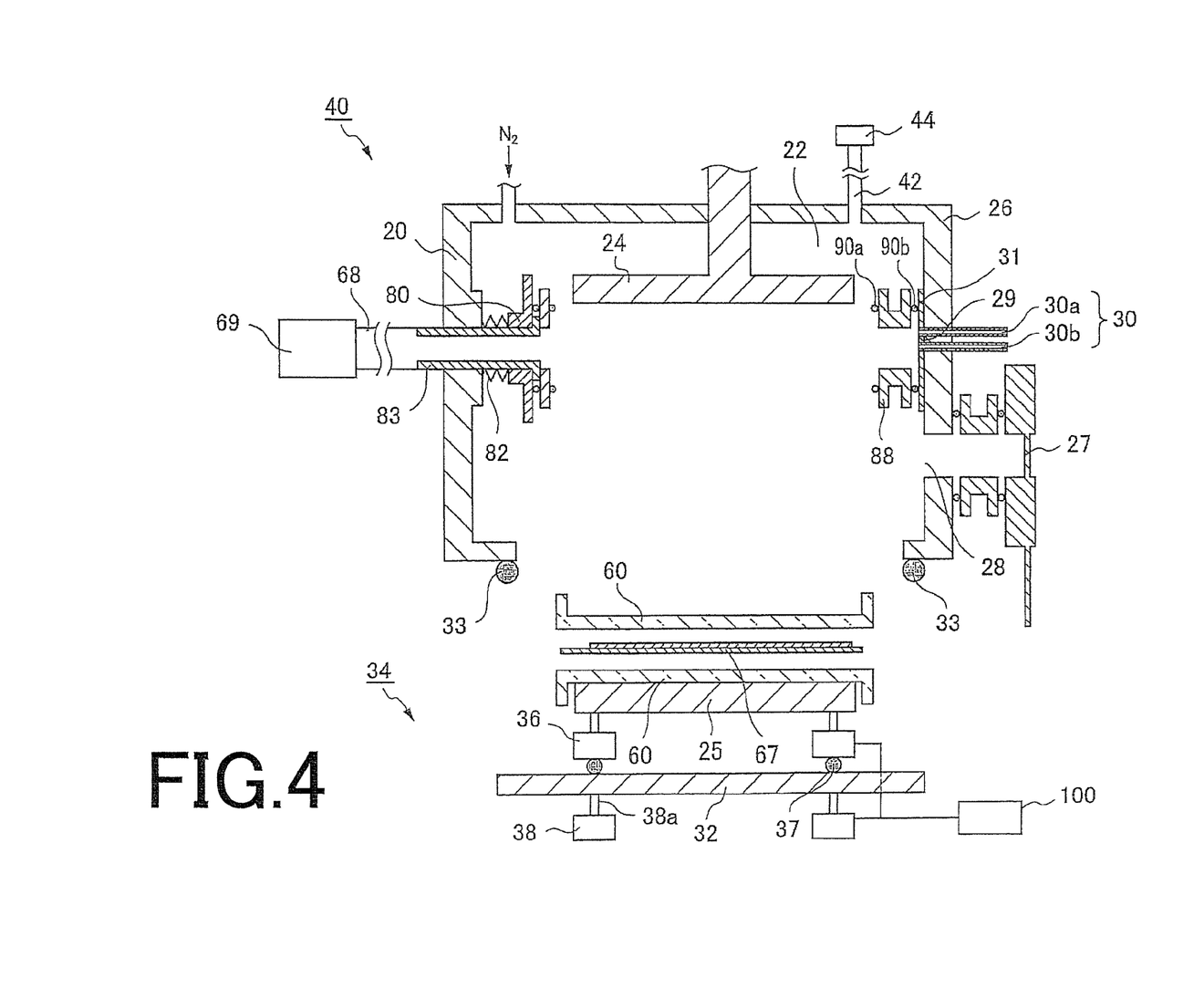
FIG. 4 is a sectional view illustrating a state in a cleaning process in the atomic layer deposition apparatus of FIG. 1.

FIG. 4 is a sectional view illustrating a state of the atomic layer deposition apparatus 10 during a cleaning process. In FIG. 4, the lower portion 34 and the upper portion 40 of the first container 20 are separated from each other.

In order to clean the second container 60, the second container 60 is taken out to the outside of the first container 20. In order to take out the second container 60 to the outside of the first container 20, the lower portion 34 including the bottom surface 32 of the first container 20 is moved (that is, to the immediately downward direction) to be separated from the upper portion 40, and the lower portion 34 is moved to the position where the second container 60 can be taken out to the outside (third position) by the second moving mechanism 38. The controller 100 controls the second moving mechanism 38 to move the lower portion 34.

The position where the second container 60 can be taken out to the outside means a position where the uppermost position in height direction of the second container 60 is lower than the lowermost position in height direction of the upper portion 40 of the first container 20. In the cleaning process, preferably the controller 100 controls the first moving mechanism 36 such that the length of the support mechanism 36a is shortened as much as possible. Therefore, the profile in height direction of the atomic layer deposition apparatus 10 can be reduced.

As illustrated in FIG. 4, after the upper portion 40 and the lower portion 34 of the first container 20 are separated from each other, the first moving mechanism 36 is moved in the in-plane direction of the bottom surface 32 of the first container 20, which allows the second container 60 to be moved from immediately below the upper portion 40 of the first container. Therefore, the second container 60 is detached from the first container 20.

The second container 60 provided in the first container 20 can be easily taken out in the embodiment illustrated in FIG. 4, so that the second container 60 can easily be cleaned. For example, the cleaning is performed by wet etching.

DESCRIPTION OF LETTERS OR NUMERALS 10 atomic layer deposition apparatus
12 substrate
20 first container
22 first inner space
24, 25 heater
26 wall surface
27 shutter
28 substrate carrying-in and carrying-out port
29 gas introduction port
30, 30a, 30b gas introduction pipe
31 anti-adhesion plate
32 bottom surface
33 O-ring
34 lower portion
36 first moving mechanism
36a support mechanism
37 caster
38 second moving mechanism
38a support mechanism
40 upper portion
42 exhaust pipe
44 exhaust unit
60 second container
62 second inner space
64 first opening
66, 66a, 66b second opening
67 substrate support portion
68 exhaust pipe
69 exhaust unit
70 fork portion
80 fixing member
82 square-shaped bellows
83 anti-adhesion plate
84, 88 spacer
86a, 86b, 90a, 90b O-ring
100 controller

The invention claimed is:

1. An atomic layer deposition apparatus for forming a thin film on a substrate, comprising:
a first container that defines a first inner space and includes a substrate carrying-in and carrying-out port and a gas introduction port in different positions, the substrate carrying-in and carrying-out port and the gas introduction port being provided in an identical wall surface of the first container, the substrate being carried in and out through the substrate carrying-in and carrying-out port, gas being introduced through the gas introduction port to form the thin film on the substrate;
a second container that is provided inside the first container to define a second inner space separated from the first inner space, the second container including a first opening;
a first moving mechanism that moves the second container in a predetermined direction; and
a controller that controls the first moving mechanism such that the second container is moved to a first position where the substrate carrying-in and carrying-out port and the first opening are located opposite each other when the substrate is carried in and out, the controller controlling the first moving mechanism such that the second container is moved to a second position where the gas introduction port and the first opening are located opposite each other when the thin film is formed on the substrate.

2. An atomic layer deposition apparatus for forming a thin film on a substrate, comprising:
a first container that defines a first inner space and includes a substrate carrying-in and carrying-out port and a gas introduction port in different positions, the substrate being carried in and out through the substrate carrying-in and carrying-out port, gas being introduced through the gas introduction port to form the thin film on the substrate;
a second container that is formed into a canister shape and provided inside the first container to define a second inner space separated from the first inner space, the second container including a first opening;
a pressing member that presses the second container in a longitudinal direction of the canister-shaped second container to separate the second inner space from the first inner space;
a first moving mechanism that moves the second container in a predetermined direction; and
a controller that controls the first moving mechanism such that the second container is moved to a first position where the substrate carrying-in and carrying-out port and the first opening are located opposite each other when the substrate is carried in and out, the controller controlling the first moving mechanism such that the second container is moved to a second position where the gas introduction port and the first opening are located opposite each other when the thin film is formed on the substrate.

3. The atomic layer deposition apparatus according to claim 2, wherein
the second container includes a second opening on an opposite end to a side on which the first opening is included, a gas in the second inner space flowing to an outside of the second inner space through the second opening.

4. An atomic layer deposition apparatus for forming a thin film on a substrate, comprising:
a first container that defines a first inner space and includes a substrate carrying-in and carrying-out port and a gas introduction port in different positions, the first container is configured to be able to be separated into a lower portion including a bottom surface of the first container and an upper portion except the lower portion, the substrate being carried in and out through the substrate carrying-in and carrying-out port, gas being introduced through the gas introduction port to form the thin film on the substrate;
a second container that is provided inside the first container to define a second inner space separated from the first inner space, the second container including a first opening;
a first moving mechanism that moves the second container in a predetermined direction;
a second moving mechanism that moves the lower portion so as to separate the lower portion from the upper portion; and
a controller that controls the first moving mechanism such that the second container is moved to a first position where the substrate carrying-in and carrying-out port and the first opening are located opposite each other when the substrate is carried in and out, the controller controlling the first moving mechanism such that the second container is moved to a second position where the gas introduction port and the first opening are located opposite each other when the thin film is formed on the substrate, and the controller controlling the second moving mechanism such that the second container moves to a third position where the second container may be taken out to the outside when the second container is taken out to the outside of the first container.

5. The atomic layer deposition apparatus according to claim 1, wherein the second container is formed into canister shape and the first opening is provided at an end of the canister-shaped second container.

* * * * *